US012727503B2

(12) United States Patent
Vidvans et al.

(10) Patent No.: US 12,727,503 B2
(45) Date of Patent: Sep. 1, 2026

(54) WIRE GUIDES, WIRE BONDING SYSTEMS, AND RELATED METHODS

(71) Applicant: Kulicke and Soffa Industries, Inc., Fort Washington, PA (US)

(72) Inventors: Amey Vidvans, Newport Beach, CA (US); Christoph B. Luechinger, Irvine, CA (US); Frank Daniels, Irvine, CA (US); Tyler Ownby, Celina, TX (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 19/344,830

(22) Filed: Sep. 30, 2025

(65) Prior Publication Data

US 2026/0157211 A1 Jun. 4, 2026

Related U.S. Application Data

(60) Provisional application No. 63/710,913, filed on Oct. 23, 2024.

(51) Int. Cl.
*B23K 20/00* (2006.01)
*H10W 72/00* (2026.01)

(52) U.S. Cl.
CPC ....... *H10W 72/0711* (2026.01); *B23K 20/004* (2013.01); *H10W 72/075* (2026.01); *H10W 72/07168* (2026.01); *H10W 72/07502* (2026.01)

(58) Field of Classification Search
CPC ........... H10W 72/0711; H10W 72/075; H10W 72/07168; H10W 72/07502; H10W 29/00; B23K 20/004; B23K 20/005; B23K 20/007
USPC .................................... 228/180.22, 4.5, 904
See application file for complete search history.

(56) References Cited

U.S. PATENT DOCUMENTS 3,646,307 A * 2/1972 Hazel ..................... B23K 20/10 228/1.1
3,718,272 A * 2/1973 Eltzroth .............. H10W 72/075 228/1.1
5,148,959 A * 9/1992 Cain .................... B23K 20/005 228/904
5,931,368 A * 8/1999 Hadar .................. B23K 20/005 228/4.5
6,206,275 B1 * 3/2001 Biggs ................... B23K 20/005 228/5.1

(Continued)

FOREIGN PATENT DOCUMENTS

CN 100423219 C * 10/2008 ........... B23K 20/005
CN 217667296 U * 10/2022

(Continued)

OTHER PUBLICATIONS

International Search report for PCT Application No. PCT/US2025/047863, completed on Feb. 2, 2026.

*Primary Examiner* — Kiley S Stoner
(74) *Attorney, Agent, or Firm* — Christopher M. Spletzer, Sr.

(57) ABSTRACT

A wire guide configured for use with a wire bonding system is provided. The wire guide includes a body portion configured to receive a wire. The body portion includes a tip portion at an end of the body portion. The tip portion defines an opening through which the wire exits the wire guide. The tip portion includes a protrusion adjacent the opening.

20 Claims, 12 Drawing Sheets

(56) References Cited

U.S. PATENT DOCUMENTS

| | | | | |
|---|---|---|---|---|
| 2003/0192414 | A1* | 10/2003 | Farassat | B23K 20/004 83/699.11 |
| 2004/0011848 | A1* | 1/2004 | Farassat | B23K 20/004 228/110.1 |
| 2006/0071049 | A1* | 4/2006 | Farassat | B23K 20/005 228/4.5 |
| 2011/0266331 | A1 | 11/2011 | Copperthite | |
| 2023/0123439 | A1* | 4/2023 | Unger | B23K 20/004 228/1.1 |
| 2023/0335532 | A1 | 10/2023 | Milton et al. | |
| 2024/0250063 | A1 | 7/2024 | Xu et al. | |
| 2025/0096195 | A1* | 3/2025 | Tophinke | H10W 72/0711 |
| 2026/0157211 | A1* | 6/2026 | Vidvans | H10W 72/0711 |

FOREIGN PATENT DOCUMENTS

| | | | | | |
|---|---|---|---|---|---|
| CN | 118786326 | | | 10/2024 | |
| HU | 199036 | B | * | 12/1989 | H10W 72/0711 |
| JP | 2005353901 | A | * | 12/2005 | H10W 72/0711 |
| JP | 2012059927 | A | * | 3/2012 | H10W 40/611 |
| JP | 2023-532720 | | | 7/2023 | |
| KR | 10-0949443 | | | 3/2010 | |
| TW | 201401400 | A | * | 1/2014 | H10W 72/075 |
| WO | WO-2026089858 | A1 | * | 4/2026 | H10W 29/00 |

* cited by examiner 10
102
104
104b
104a 10
104b1
104a
104
104b 104b
104a
10
102

106c
108
102
10
104
104b
106'
100'

108
10
102a
102
104
104b
106'
106c
100'
106b1'
106b'

110
10
102a
102
104
104b
106"
106b"
100"

600
610
100
112
106
102
104
104b
130
122
142
140
602
120
120a
104b1
10
120'

104
10
104b1
120
104b
120b
120'
120'
100
112
102
104
104b
610
106
130
122
600
140
602

104b1
10
104
120
104b
120b
120a
120'
100
112
102
104
104b
610
106
130
122
600
140
602

WIRE GUIDES, WIRE BONDING SYSTEMS, AND RELATED METHODS

CROSS REFERENCE TO RELATED APPLICATION

This application claims the benefit of U.S. Provisional Application No. 63/710,913, filed on Oct. 23, 2024, the content of which is incorporated herein by reference.

FIELD

The invention relates to wire guides for use in wire bonding systems, and in particular, to wire guides used with wedge bonding tools, and related methods.

BACKGROUND

In the processing and packaging of semiconductor devices, wire bonding continues to be the primary method of providing electrical interconnection between two locations within a package (e.g., between a die pad of a semiconductor die and a lead of a leadframe). More specifically, using a wire bonder (also known as a wire bonding machine) wire loops are formed between respective locations to be electrically interconnected. The primary methods of forming wire loops are ball bonding and wedge bonding. In forming the bonds between (a) the ends of the wire loop and (b) the bond site (e.g., a die pad, a lead, etc.) varying types of bonding energy may be used, including, for example, ultrasonic energy, thermosonic energy, thermocompressive energy, amongst others.

In wedge bonding applications, a wire is typically fed through a wire guide during bonding and looping operations. For example, the wire guide aids in aligning the wire under a wedge bonding tool during bonding of the wire to a bonding location. The wire guide may also aid in maintaining the wire in alignment with the wedge bonding tool during looping so that the wire is properly aligned at a second bond location.

It would be desirable to provide improved wire guides for use in wedge bonding systems.

SUMMARY

According to an exemplary embodiment of the invention, a wire guide configured for use with a wire bonding system is provided. The wire guide includes a body portion configured to receive a wire, the body portion including a tip portion at an end of the body portion. The tip portion defines an opening through which the wire exits the wire guide. The tip portion includes a protrusion adjacent the opening.

According to another exemplary embodiment of the invention, a wire bonding system for forming wire bonds on a workpiece is provided. The wire bonding system includes a support structure for supporting the workpiece during formation of a wire loop. The wire bonding system also includes a wire guide including a body portion configured to receive a wire, the body portion including a tip portion at an end of the body portion. The tip portion includes an opening through which the wire exits the wire guide. The tip portion also includes a protrusion adjacent the opening. The wire bonding system also includes a wedge bonding tool configured to bond the wire to the workpiece during formation of the wire loop.

According to other embodiments of the invention, the wire guide and wire bonding system recited in the two immediately preceding paragraphs may have any one or more of the following features: the wire contacts the protrusion as the wire exits the wire guide; the protrusion has a radius; the radius of the protrusion has a value of 125-1000 microns; the radius of the protrusion has a value of 25%-200% of a diameter of the wire; the wire guide is formed of a polymer material including a reinforcement filler; a holder for holding the body portion, the wire passing through the holder prior to receipt by the body portion; the protrusion is configured to form a stress concentration in the wire when the wire is forced against the protrusion; a wire clamp configured to hold the wire in a position with respect to the wire guide; and the protrusion is configured to form a stress concentration in the wire when the wire is forced against the protrusion by closing the wire clamp while moving the wire guide (e.g., through motion of a bond head assembly carrying the wire guide).

According to another exemplary embodiment of the invention, a method of forming a wire loop using a wire bonding system is provided. The method includes the steps of: (a) forming a wire bond at a bonding location of a workpiece using a wedge bonding tool; and (b) feeding a wire, continuous with the wire bond, through a wire guide while moving the wedge bonding tool and the wire guide away from the bonding location after step (a), the wire contacting a protrusion adjacent to an opening through which the wire exits the wire guide, the wire contracting the protrusion throughout step (b).

According to other embodiments of the invention, the method recited in the immediately preceding paragraph may have any one or more of the following features: a step of (c) closing a wire clamp on the wire during step (b) to generate tension in the wire such that the wire is forced against the protrusion to form a stress concentration in the wire; step (c) includes forming the stress concentration at a point between 30%-70% of a length of the wire loop; the wire guide includes a body portion including a straight tube; the protrusion includes a radius where the wire contacts the protrusion during step (b); and a step of bonding the wire to a second bonding location after step (b).

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION

Figure 2A:
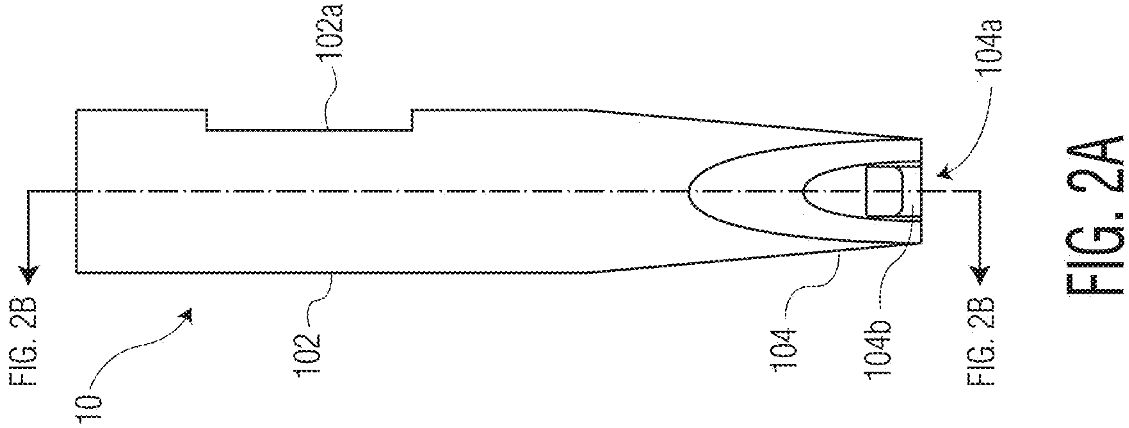
FIGS. 2A-2D are various views illustrating a wire guide in accordance with another exemplary embodiment of the invention.

According to certain exemplary embodiments of the invention, wire guides are provided for wire bonding systems. Such a wire guide may include a protrusion (e.g., a protrusion including a radius) adjacent an opening at a tip portion of the wire guide. A two-piece wire guide assembly may be provided including a wire guide holder and a wire guide configured to be engaged with the wire guide holder. The wire guide may be a tubular like insert (e.g., a straight tube) formed of a suitable material (e.g., a ceramic such as alumina, a polymer, a polymer including a glass fiber (e.g., where the glass fiber acts as a reinforcement filler), a polymer including a carbon fiber (e.g., where the carbon fiber acts as a reinforcement filler), etc.). Such a wire guide may be a consumable item, for example, configured for re-use with the wire guide holder.

The inventive wire guides (and wire guide assemblies) may be used to enable wire looping capability at smaller stepback distances (i.e., SBD) and lower wire loop heights. Specific motions of a bond head assembly, and operation of a wire clamping, may be used to achieve a desired wire loop shape (e.g., a desired wire loop height).

A protrusion having a desired radius of curvature may be used to localize the stress on the surface of a wire as the wire is fed out during the lifting motion to a top of loop position after formation of a first bond of a wire loop. The localization of this stress introduces plastic deformation in the wire resulting in an increased curvature in the wire. For example, this increased curvature may result in (i) buckling of the wire during a downward motion of a bond head assembly (e.g., toward a second bond location) and (ii) improvements to the seating of the wire, and improvements in force transmission to the wire, as the bond head assembly moves downward (e.g., toward the second bond location).

According to certain exemplary embodiments of the invention, a change in the timing of the opening and closing of a wire clamp of a wire clamp system may be utilized to further shape the wire. For example, by closing the wire clamp during a lifting motion of the bond head assembly, tensile stress is placed on the wire. Such a tensile stress may be used to elongate and/or introduce a weak spot at a desired point in the wire to improve buckling of the wire during a downward motion of the bond head assembly.

The radius of curvature of the protrusion may be able to "clean" the surface of a wire (e.g., a copper wire) as it exits the wire guide. This could be accomplished using at least one of (or any combination of): (i) a coating on the protrusion that cleans surface contamination; (ii) applying ultrasonic energy to actuate the wire against the protrusion; and (iii) a surface texture on the protrusion that removes the contamination. The imparted surface texture on the wire may have a benefit of increasing the coupling of the wire to a bonding location during formation of a wire bond enabling bonding with lower substrate damage.

According to certain exemplary embodiments of the invention, ultrasonic energy may be selectively applied during wire loop formation (e.g., during motion of the bond head assembly through a secondary transducer).

Figure 1:
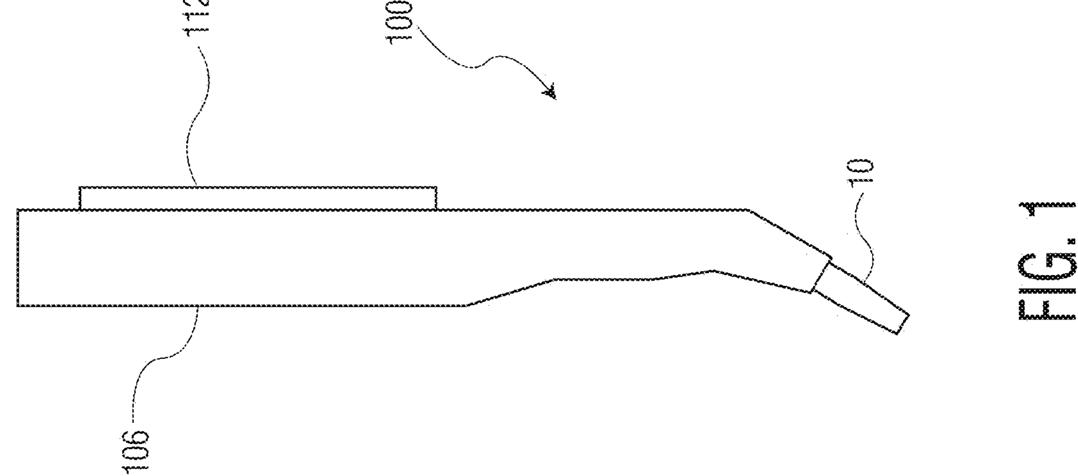
FIG. 1 is a block diagram side view illustrating a wire guide in accordance with an exemplary embodiment of the invention.

Referring now to FIG. 1, a wire guide 100 is illustrated. Wire guide 100 includes a wire guide 10, a holder 106, and a wire clamp 112. Wire guide 10 is inserted into a body portion receptacle 106*b* (e.g., see FIGS. 4A and 5A) of holder 106. Wire guide 10 is illustrated and described in more detail with reference to FIGS. 2A-2D. Holder 106 is configured to receive a wire (e.g., wire 120 in FIGS. 3B-3D) and guide the wire into and through wire guide 10. Holder 106 provides an angle to direct the wire (e.g., wire 120) toward a wedge bonding tool (e.g., wedge bonding tool 130 in FIGS. 6A-6E). Holder 106 is illustrated and described in additional detail with reference to FIGS. 4A, 4B, 5A, and 5B. Wire clamp 112 is configured to hold the wire in a position with respect to wire guide 100 and/or wire guide 10 (e.g., by pressing the wire against a surface of holder 106). Wire clamp 112 is illustrated and described in additional detail with reference to FIGS. 3B-3D.

Although wire guide 100 is illustrated and described as including wire guide 10 that is separate from, and insertable into, a holder 106, the invention is not limited to such. It is contemplated that wire guide 100 could be a single piece (e.g., wherein wire guide 10 is integrated with holder 106). It is further contemplated that holder 106 could be straight while wire guide 10 includes an angle. Applicant notes that for the purposes of this application, "wire guide" can refer to (1) a wire guide such as wire guide 10, (2) a wire guide assembly such as wire guide 100, configured to include a wire guide such as wire guide 10, or (3) any wire guide within the scope and spirit of the invention.

Figures 2B, 2C, 2D:
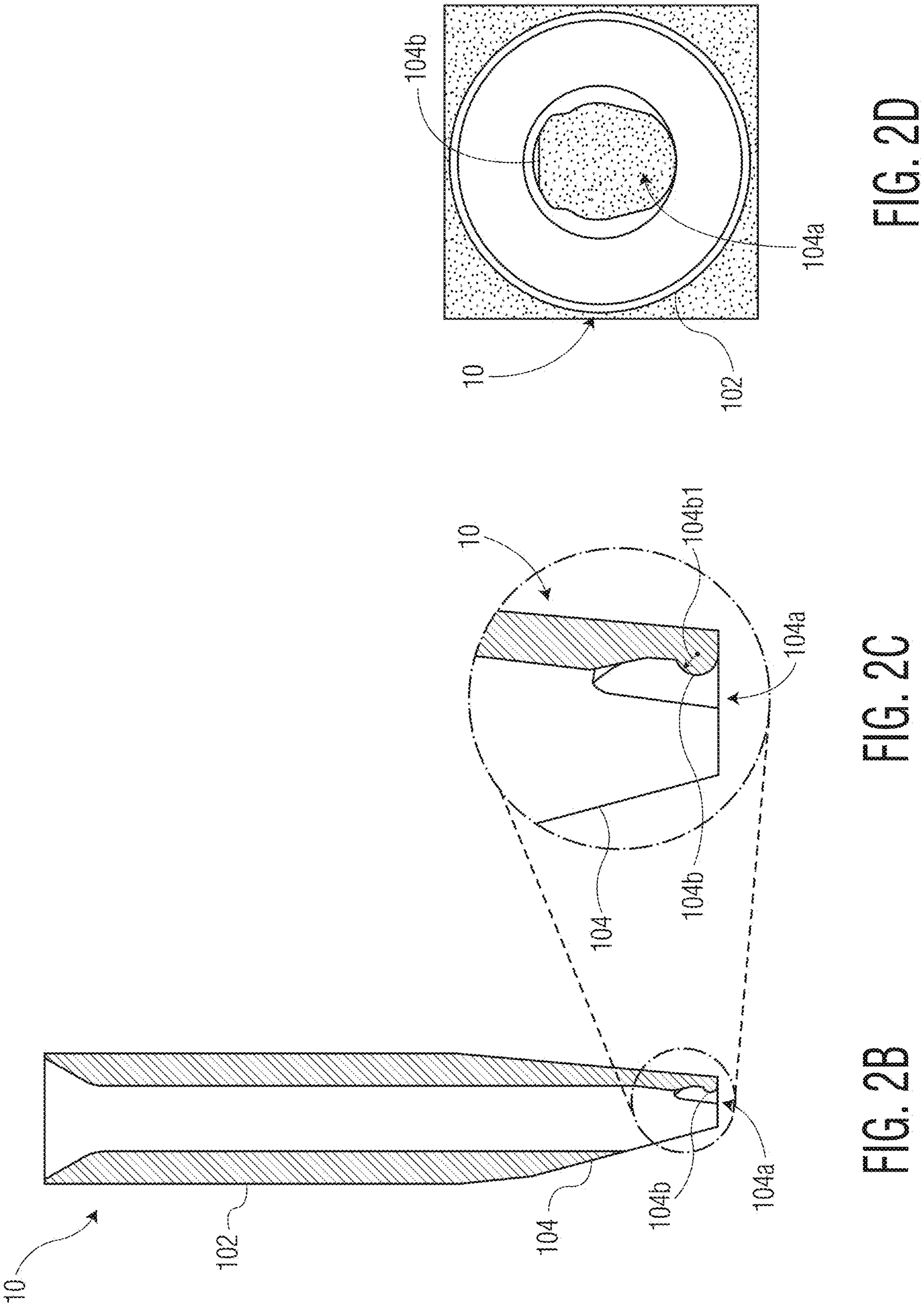

Referring now to FIGS. 2A-2D, wire guide 10 is illustrated in additional detail. In FIG. 2A, a front view of wire guide 10 depicts a body portion 102 including a tip portion 104 at an end of body portion 102. Body portion 102 includes a flat portion 102*a* that is used in connection with attaching wire guide 10 into a wire guide assembly (e.g., wire guide 100 of FIG. 1, wire guide 100' of FIG. 4A, or wire guide 100" of FIG. 5A). Tip portion 104 defines an opening 104*a* through which a wire exits wire guide 10 (e.g., wire 120 in FIGS. 4B-4D). Tip portion 104 also includes a protrusion 104*b* adjacent to opening 104*a*. Wire guide 10 may be formed of a ceramic material (e.g., sintered alumina), a polymer material (e.g., homoacetal polymer, polyamide, etc.), a polymer material including a reinforcement filler (e.g., a glass fiber reinforcement filler, a carbon fiber reinforcement filler, etc.), among other materials. FIG. 2B, a section view along line "FIG. 2B" of FIG. 2A, illustrates that exemplary wire guide 10 is a straight tube. Body portion 102 is configured to receive a wire (e.g., wire 120 in FIGS. 4B-4D) and provide the wire to opening 104*a* of tip portion 104.

FIG. 2C is a detailed view of a portion of FIG. 2B including tip portion 104. As illustrated in FIG. 2C, protrusion 104*b* includes a radius 104*b*1. Exemplary ranges for the value of radius 104*b*1 are between 75-1000 microns, 125-500 microns, and 175-400 microns. Tip portion 104 is configured so that, during formation of a wire loop, a wire that is fed through wire guide 10 contacts protrusion 104*b* at radius 104*b*1 as it exits wire guide 10 through opening 104*a*. FIG. 2D is a top view of wire guide 10 illustrating body portion 102, opening 104*a*, and protrusion 104*b*. A textured background is included in FIG. 2D to aid in illustrating opening 104*a*.

Figure 3B:
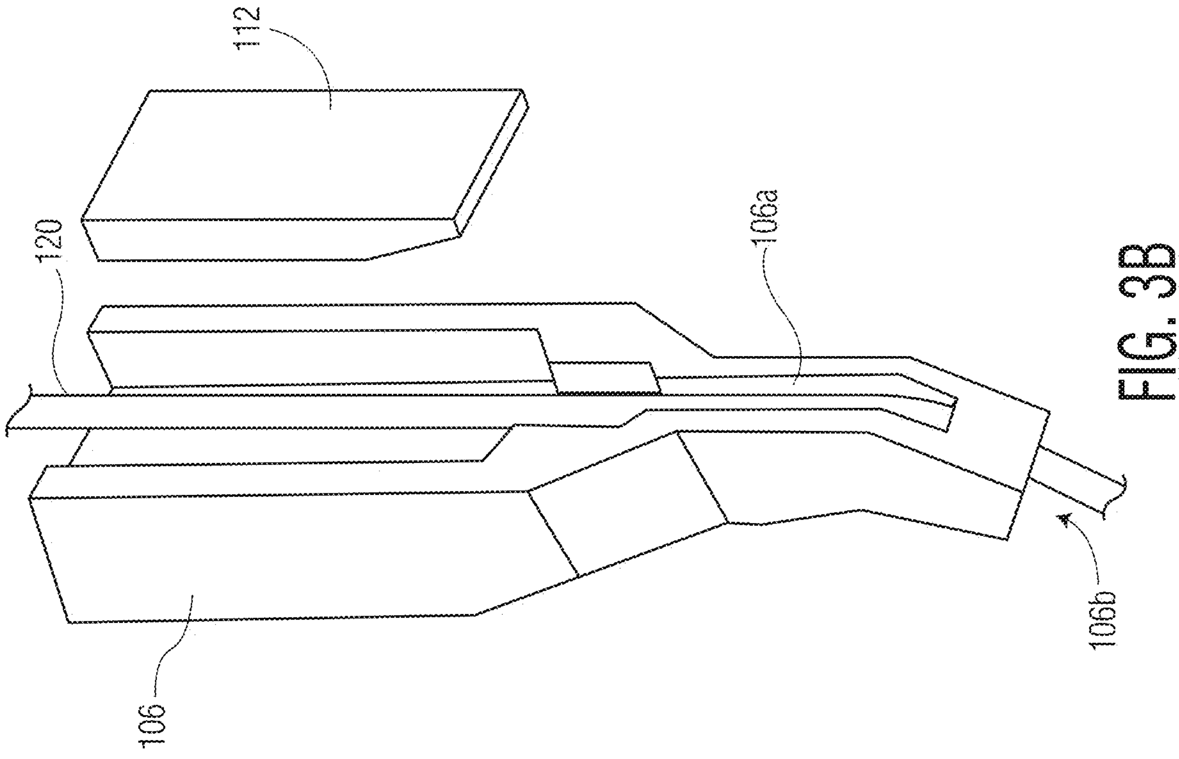
FIGS. 3A-3D are perspective back views illustrating part of a wire guide in accordance with yet another exemplary embodiment of the invention.
Figure 3A:
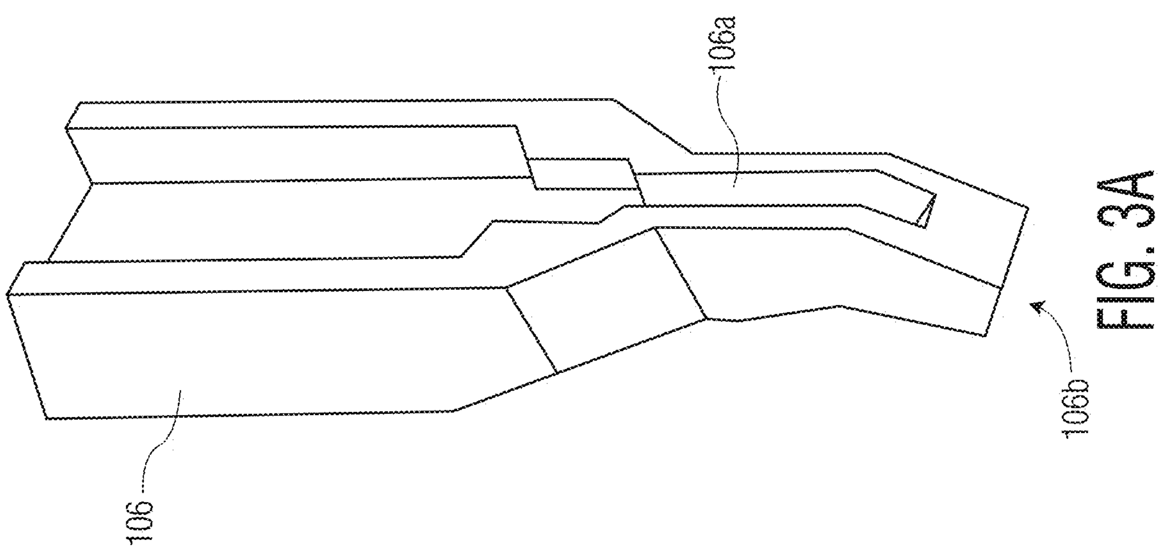

FIGS. 3A-3D illustrate holder 106. As illustrated in FIG. 3A, holder 106 defines a body portion receptacle 106*b* (e.g., to receive body portion 102 of wire guide 10, described herein) at an end of a wire channel 106*a*. FIG. 3B illustrates a wire 120 passing through wire channel 106*a* and threaded through body portion receptacle 106*b*. In this manner, holder 106 guides wire 120 to be received by body portion 102 of wire guide 10 when wire guide 10 is engaged in body portion receptacle 106*b*.

Figure 3D:
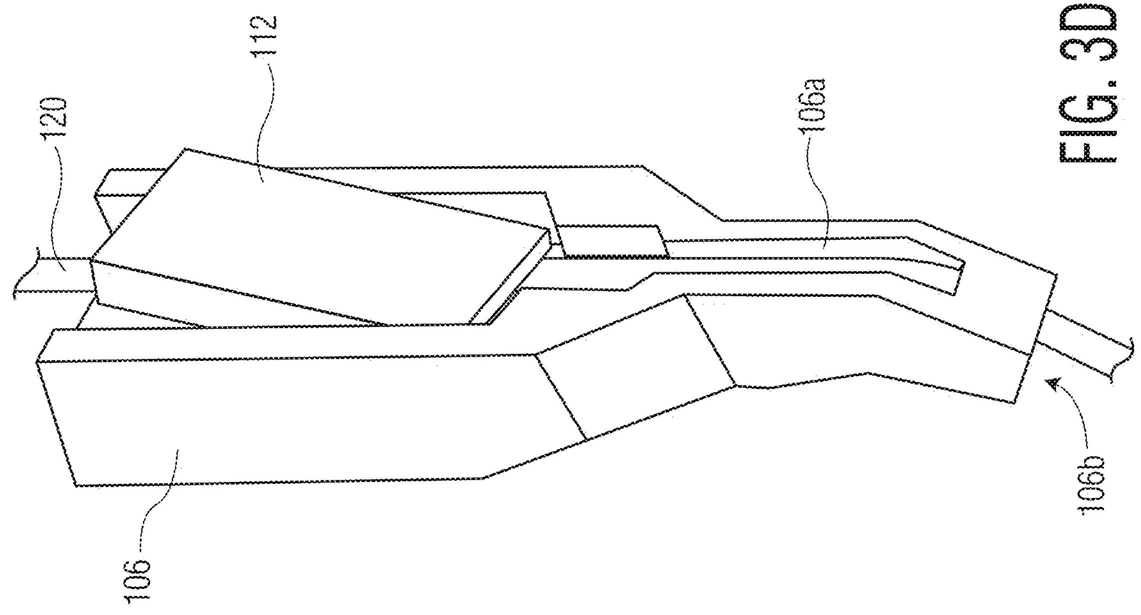
Figure 3C:
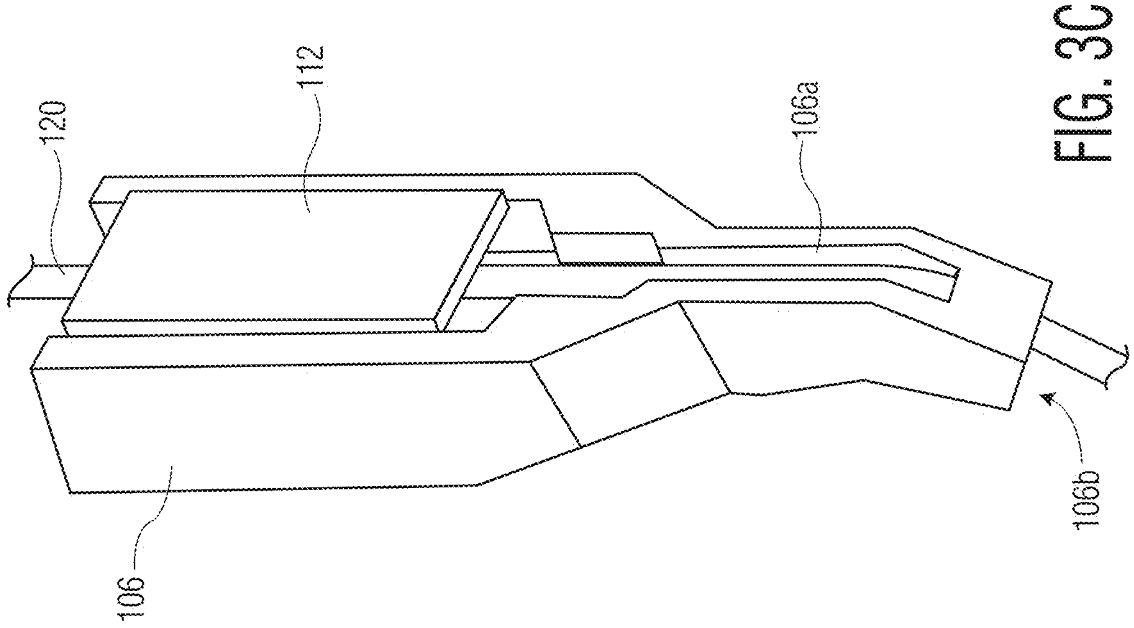

FIG. 3B further illustrates a wire clamp 112 separate from holder 106. Wire clamp 112 is configured to (1) allow wire 120 to pass freely in an "open" configuration and (2) hold wire 120 with respect to holder 106 (and wire guide 10) in a "closed" configuration. In FIG. 3C, wire clamp 112 is coupled to holder 106 and illustrated in an "open" configuration (i.e., where wire 120 is able to pass freely through wire channel 106*a*). In FIG. 3D, wire clamp 112 is illustrated in a "closed" configuration such that wire clamp 112 holds wire 120 in a position with respect to holder 106 (i.e., where wire 120 cannot move relative to holder 106). Where holder 106 is part of a wire guide (e.g., wire guide 100), wire clamp 112 holds wire 120 with respect to the wire guide in the "closed" configuration. Wire clamp 112 may be operated by a computer of a wire bonding system.

Figure 4B:
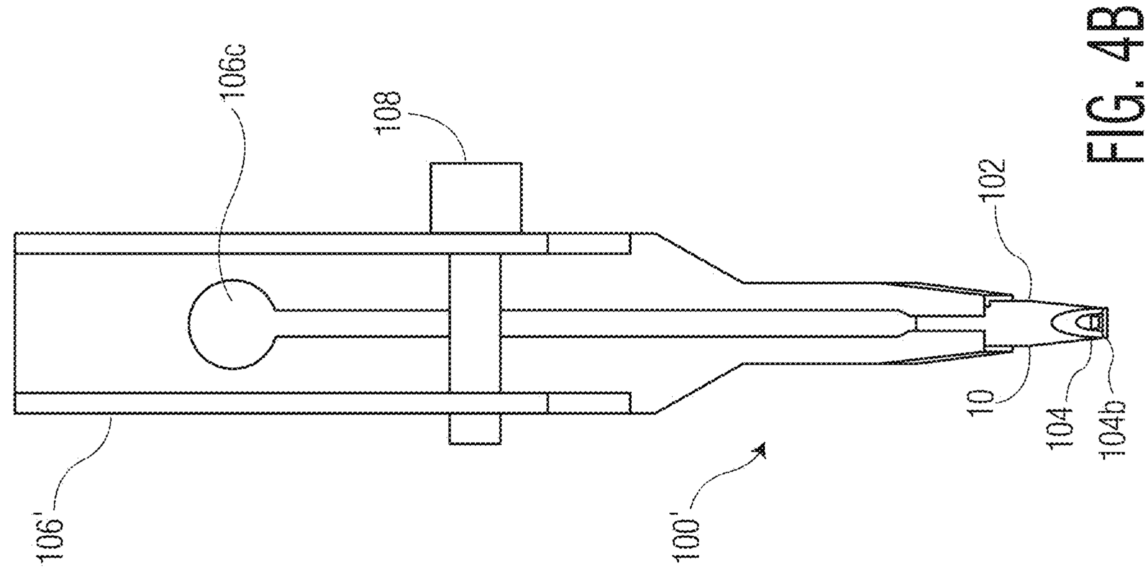
FIGS. 4A and 4B are front views illustrating a wire guide in accordance with yet another exemplary embodiment of the invention.
Figure 4A:
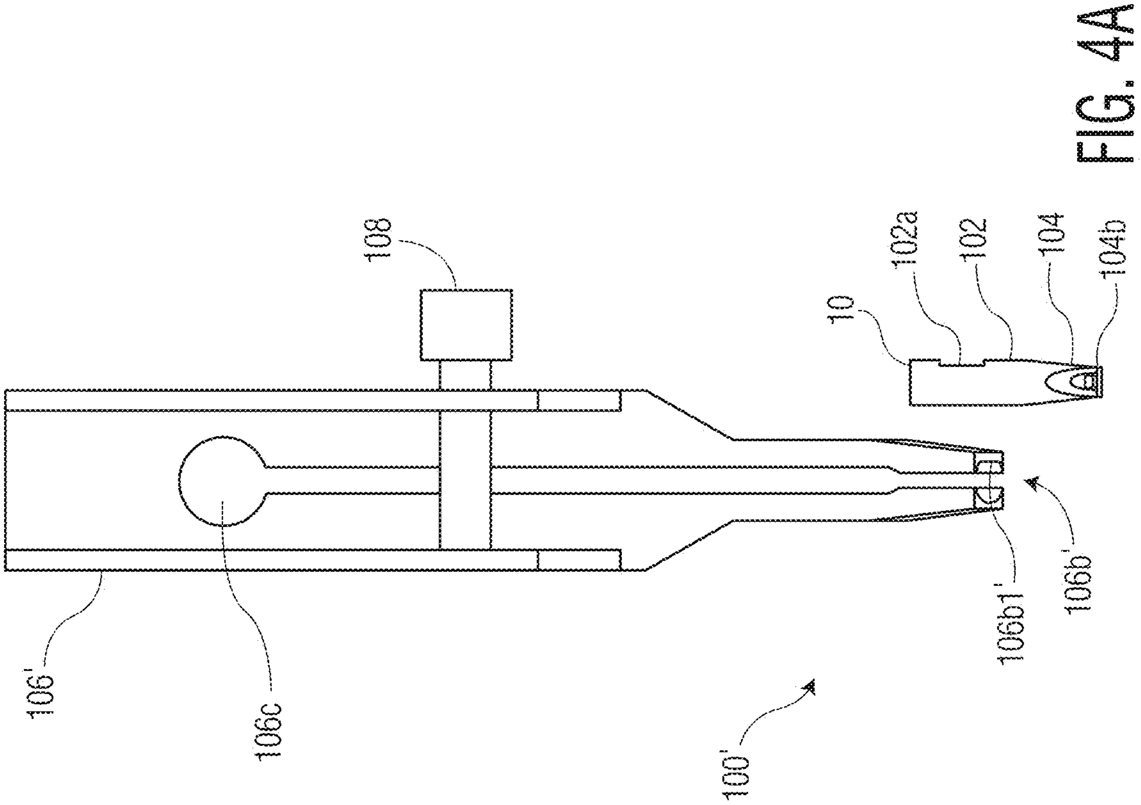

In FIGS. 4A and 4B, a wire guide 100' is illustrated. Wire guide 100' includes a holder 106' and wire guide 10. Wire guide 100' has a "split clamp" configuration, wherein wire guide 10 is secured within holder 106' via a clamping bolt 108 configured to close an opening 106*c* defined by holder 106' to clamp wire guide 10 in place.

In FIG. 4A, holder 106' is illustrated in an "open" configuration, where clamping bolt 108 is not tightened, such that wire guide 10 may be inserted into a body portion receptacle 106*b*' defined by holder 106'. Body portion receptacle 106*b*' includes a flat portion 106*b*1' that corresponds to flat portion 102*a* of wire guide 10. Such an interaction between flat portion 106*b*1' and flat portion 102*a* may improve engagement between holder 106' and wire guide 10.

In FIG. 4B, holder 106' is illustrated in a "clamped" configuration, where clamping bolt 108 is tightened to close opening 106*c* around wire guide 10, which has been inserted into body portion receptacle 106*b*'. Flat portion 102*a* is aligned with flat portion 106*b*1'. For example, wire guide 10 may be inserted into body portion receptacle 106*b*' via the front of holder 106' (e.g., wherein body portion 102 is inserted first) or via the rear of holder 106' (e.g., wherein tip portion 104 is inserted first and passes completely through body portion receptacle 106*b*').

Figures 5A, 5B:
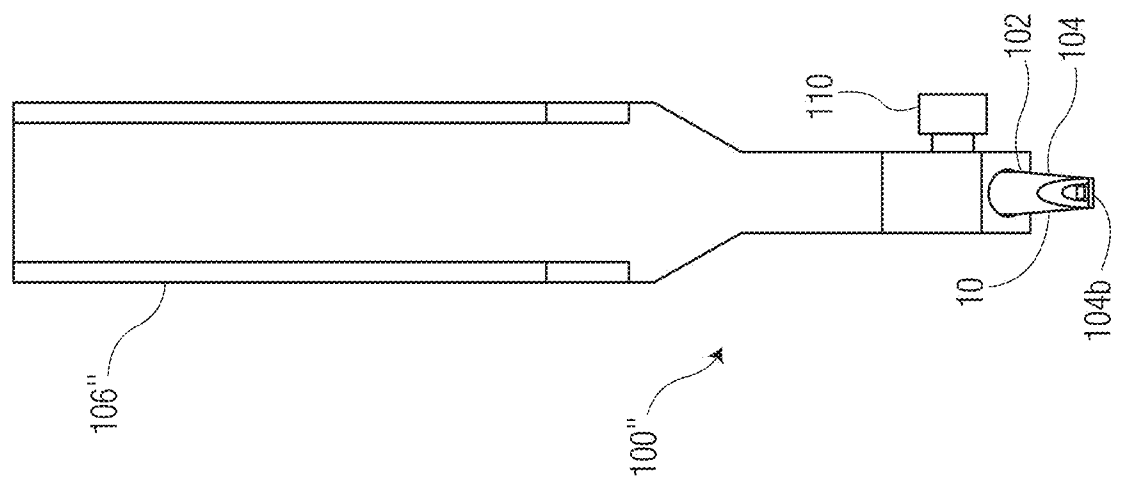
FIGS. 5A and 5B are front views illustrating a wire guide in accordance with yet another exemplary embodiment of the invention.

FIGS. 5A and 5B illustrate a wire guide 100" including a holder 106", which has an alternative configuration for securing a wire guide as compared to holder 106'. In particular, holder 106" has a "set screw" configuration, wherein wire guide 10 is secured within holder 106" via a set screw 110 configured to clamp wire guide 10 at flat portion 102*a* of wire guide 10. In FIG. 5A, holder 106" is illustrated in an "open" configuration, where set screw 110 is not tightened, allowing wire guide 10 to be inserted into a body portion receptacle 106*b*". Set screw 110 is configured to engage flat portion 102*a*, which may improve engagement between holder 106" and wire guide 10. FIG. 5B illustrates holder 106" in a "clamped" configuration, where set screw 110 is tightened against flat portion 102*a* of wire guide 10, which has been inserted into body portion receptacle 106*b*".

Although FIGS. 4B and 5B illustrate particular configurations for securing a wire guide in a holder, the invention is not limited to such configurations. Any configuration for securing a wire guide in a holder may be used within the scope of the invention (e.g., friction fit, screw threads, magnetic engagement, etc.).

Referring now to FIGS. 6A-6E, a wire bonding system 600 is illustrated. Wire bonding system 600 includes (i) a bond head assembly 610 configured to carry a wire guide 100 and a wedge bonding tool 130 along a plurality of axes and (ii) a support structure 602 configured to support a workpiece 140 during formation of a wire loop. Wire guide 100 includes wire guide 10, holder 106 (e.g., wherein holder 106 is any of: holder 106', holder 106", or any other holder within the scope of the invention), and wire clamp 112. A wire 120 is disposed through wire guide 100 (e.g., see FIGS. 3A-3D), with wire 120 passing through holder 106 prior to receipt by body portion 102 of wire guide 10. The relative size of wire guide 10, as compared to holder 106, is exaggerated for demonstrative purposes. Wedge bonding tool 130 is configured to bond a wire to the workpiece during formation of a wire loop. Wire 120 may be any material (e.g., copper, aluminum, gold, etc.).

Figure 6A:
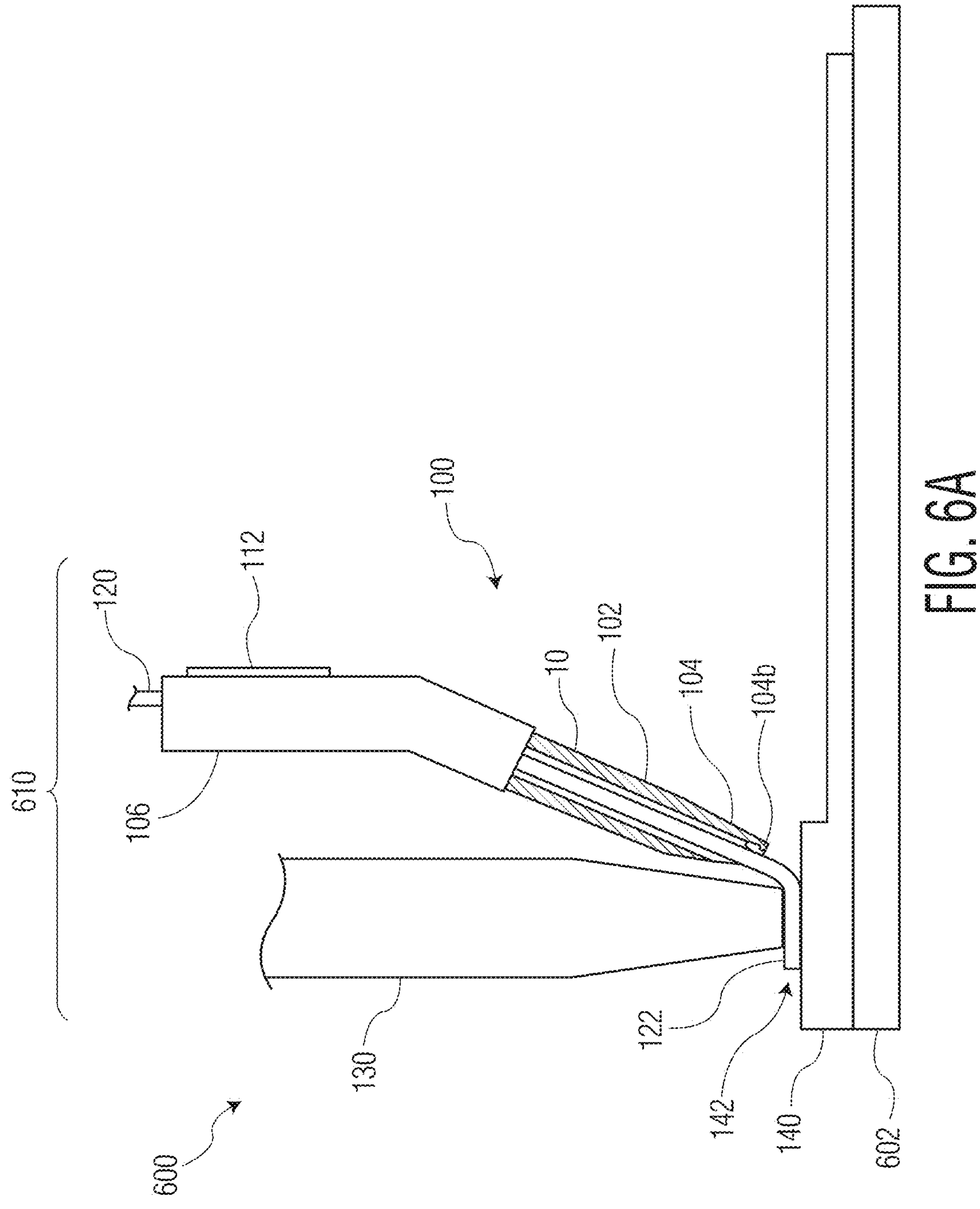
FIGS. 6A-6E are block diagram side views illustrating a wire bonding system in accordance with an exemplary embodiment of the invention.

In FIG. 6A, wedge bonding tool 130 is forming a wire bond 122 at a bonding location 142 of workpiece 140. The wedge bonding tool can be any type of wedge bonding tool (e.g., a ribbon bonding tool, a wedge bonding tool with a U- or V-shaped groove, etc.).

Figure 6B:
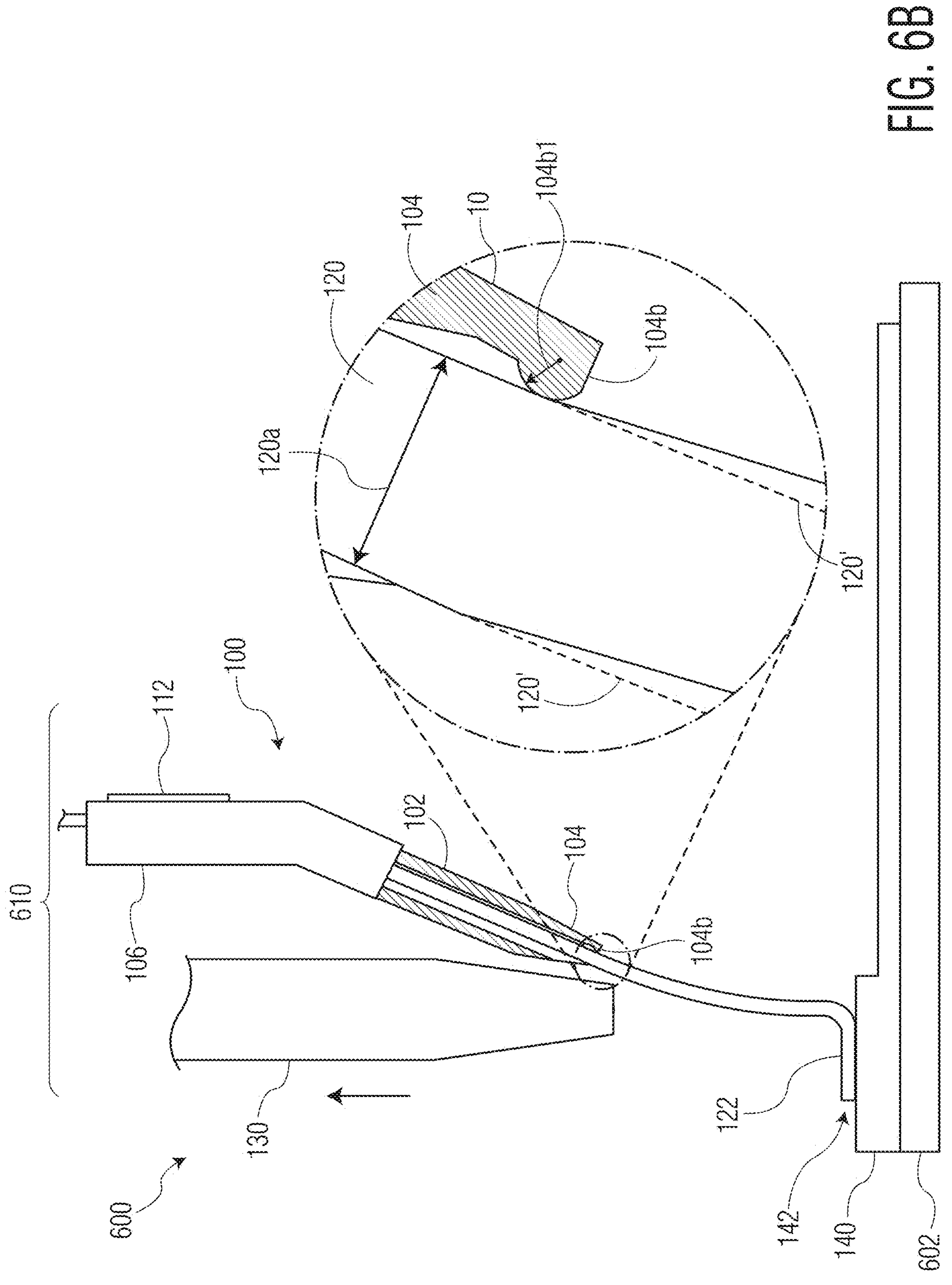

In FIG. 6B, wire 120, continuous with wire bond 122, is fed through wire guide 100 (including wire guide 10) while moving bond head assembly 610, including wedge bonding tool 130 and wire guide 100, away from bonding location 142 after wire bond 122 is formed. Wire clamp 112 is in an "open" configuration to facilitate the feeding of wire 120 through wire guide 100.

In the detailed view of FIG. 6B, it is illustrated that wire 120 is in contact with radius 104*b*1 of protrusion 104*b* as wire 120 exits wire guide 10 throughout the feeding of wire 120 through wire guide 100 (including wire guide 10). The contact between wire 120 and protrusion 104*b* may induce a permanent deformation in the wire to create a curvature (e.g., wherein the absence of protrusion 104*b* may result in the wire following an unaltered path 120' that is straighter than wire 120). The permanent deformation induced by contact with protrusion 104*b* may improve wire looping capabilities, including allowing for lower wire loop heights while allowing for closer proximity between a first bond location and a second bond location (e.g., "small stepback distances"). Radius 104*b*1 may be defined relative to a wire diameter 120*a*. For example, radius 104*b*1 may be 25%-200% of wire diameter 120*a*, 25%-80% of wire diameter 120*a*, and/or 35%-50% of wire diameter 120*a*.

The continuous contact of wire 120 against protrusion 104*b* may clean the surface of the wire as it exits wire guide 10 (e.g., by removing surface oxides or other contaminants). Such a cleaning capability may be enhanced by including a coating on protrusion 104*b* (e.g., doped coatings impregnated with cleaning agents), applying ultrasonic energy to wire guide 10 or wire 120 during wire feeding, or providing a surface texture on protrusion 104*b* (e.g., angled knurl like patterns). Cleaning wire 120 prior to or during formation of a wire loop may improve bond quality/efficiency.

Figure 6C:
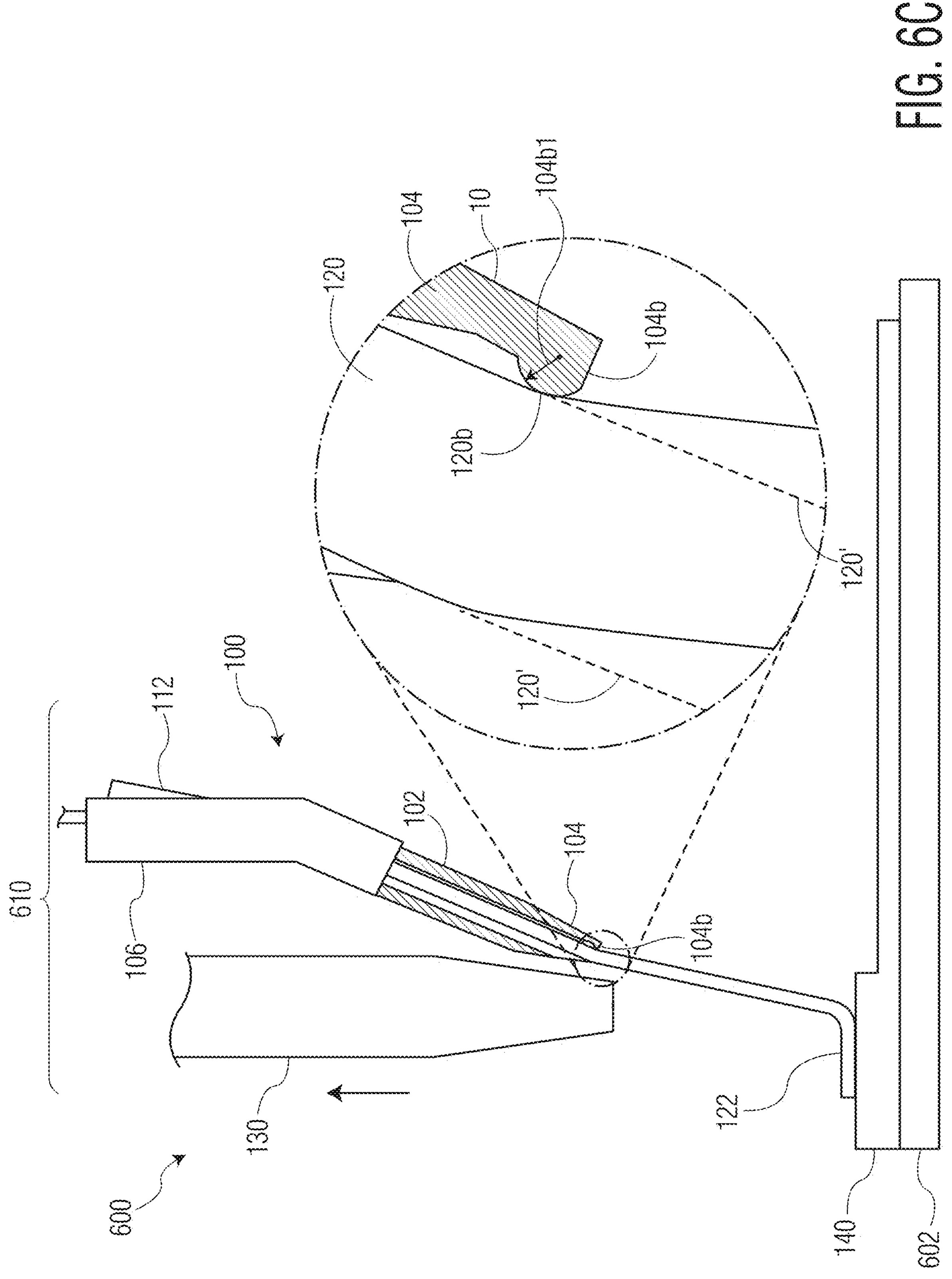

In FIG. 6C, wire clamp 112 has been closed during the motion of bond head assembly 610 (including wedge bonding tool 130 and wire guide 100) and while feeding wire 120 through wire guide 10. Closing wire clamp 112 holds wire 120 in a position with respect to wire guide 100. Additionally, closing wire clamp 112 during motion of bond head assembly 610 generates tension in wire 120 such that wire 120 is forced against radius 104*b*1 of protrusion 104*b*, which forms a stress concentration 120*b* in wire 120, and may create a localized elongation, bend, or weak point of wire 120. To increase the elongation/stress concentration, bond head assembly 610 may move along an altered motion profile (e.g., altering from the looping profile in a lateral direction). The formation of stress concentration 120*b* may further alter the shape of wire 120 (e.g., wherein forming stress concentration 120*b* alters the path of wire 112 from unaltered path 120' more so than illustrated in FIG. 6B).

It shall be understood that the closing of wire clamp 112 may be of any duration and cycle, as desired in a given application. For example, wire clamp 112 may be momentarily closed and then re-opened.

Figure 6D:
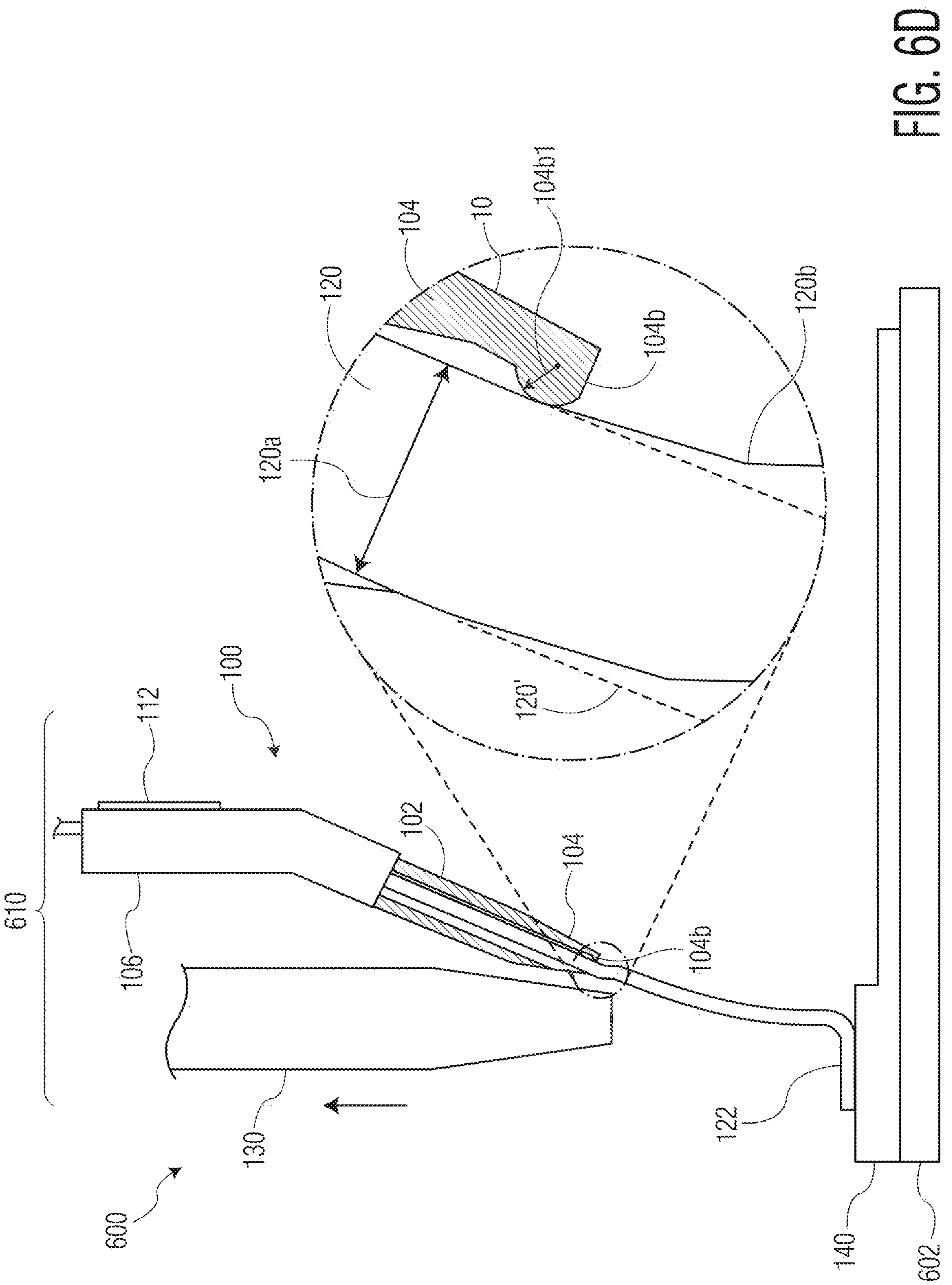
Figure 6E:
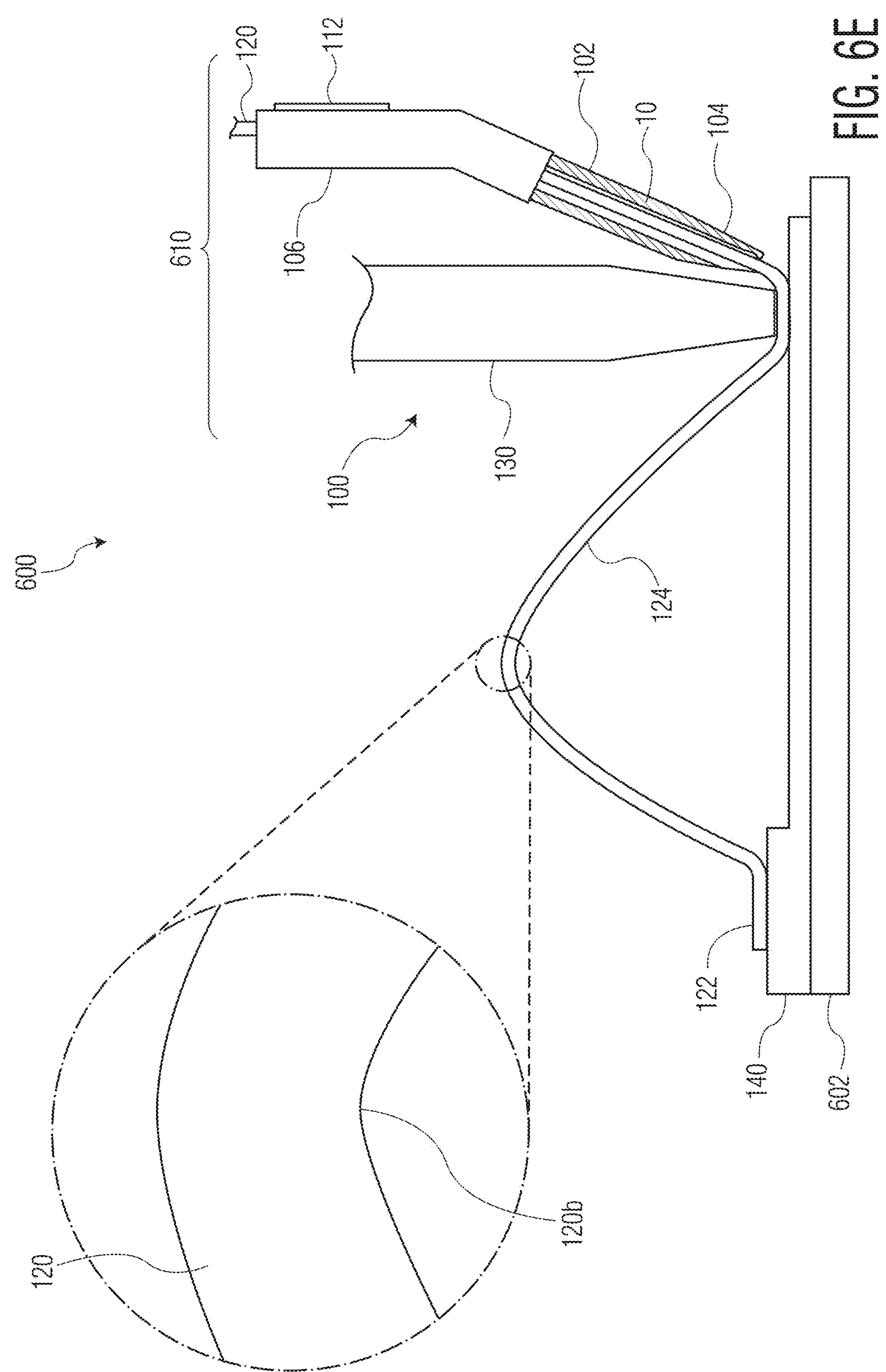

In FIG. 6D, wire clamp 112 has been reopened, wire 120 has continued to feed through wire guide 100, and protrusion 104*b* is moving away from stress concentration 120*b*. In FIG. 6E, wedge bonding tool 130 is bonding wire 120 to a second bonding location after wire loop formation. The detailed view in FIG. 6E illustrates the location of stress concentration 120*b* in the final loop profile at a "top of loop" location (e.g., the peak of the formed wire loop 124). The location of stress concentration 120*b* at the "top of loop" location may allow wire 120 to have a kink that allows improved wire loop formation (e.g., a reduced loop height). However, the invention is not limited to forming stress concentration 120*b* at the top of loop location. Exemplary ranges of the location of stress concentration 120*b* include 30%-70% along a length of the wire loop, 40%-60% along a length of the wire loop, and 40%-50% along a length of the wire loop. It is further contemplated that a stress concentration could be formed at any point along the length of the wire loop. It is further contemplated that multiple stress concentrations could be formed on the wire loop.

Figure 7:
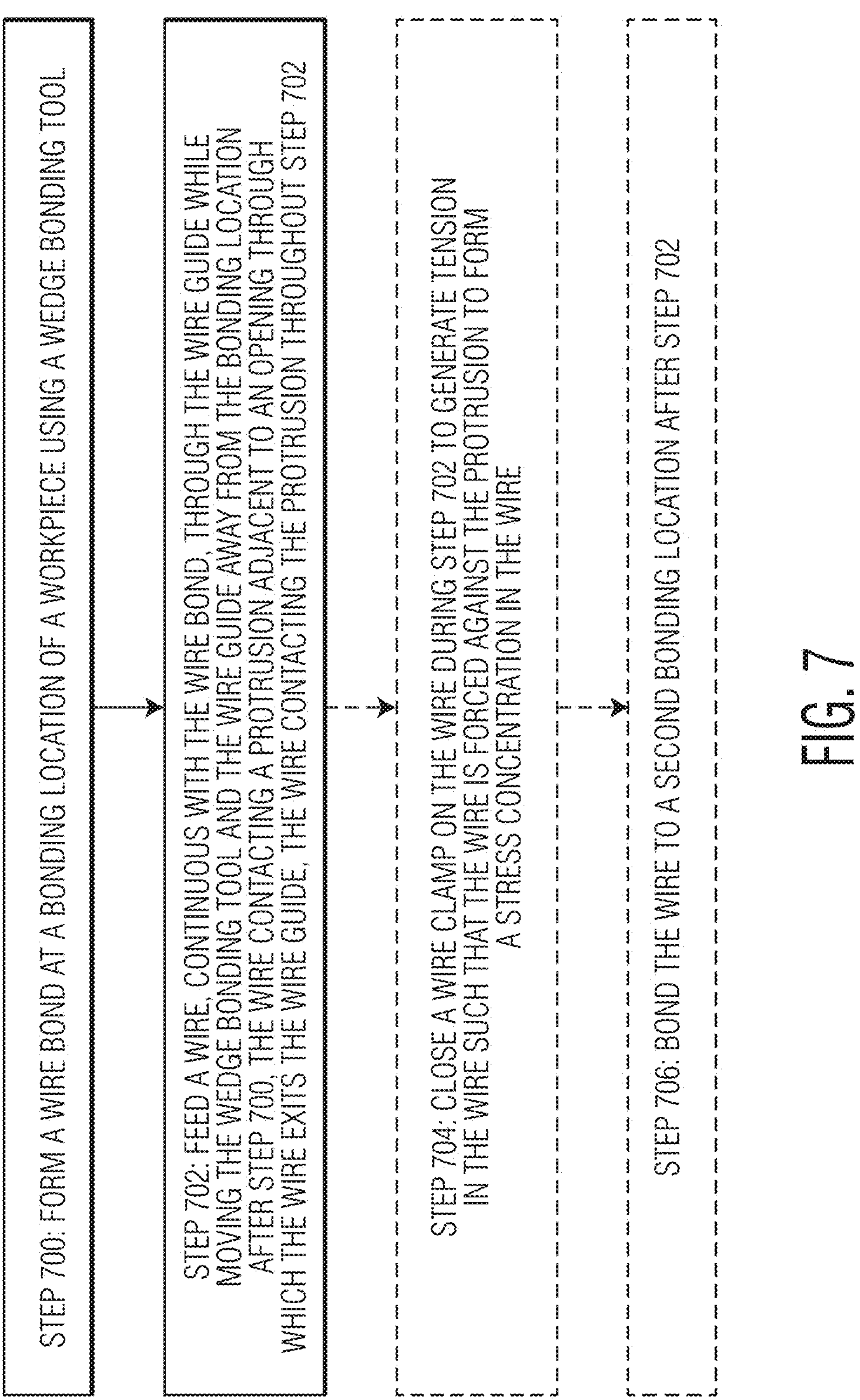
FIG. 7 is a flow diagram illustrating a method of forming a wire loop using a wire bonding system in accordance with an exemplary embodiment of the invention.

FIG. 7 is a flow diagram illustrating a method of forming a wire loop using a wire bonding system. As is understood by those skilled in the art, certain steps included in the flow diagram may be omitted; certain additional steps may be added; and the order of the steps may be altered from the order illustrated—all within the scope of the invention. At Step 700, a wire bond is formed at a bonding location of a workpiece using a wedge bonding tool (e.g., see FIG. 6A). At Step 702, a wire, continuous with the wire bond, is fed through the wire guide while moving the wedge bonding tool and the wire guide away from the bonding location after Step 700. The wire contacts a protrusion adjacent to an opening through which the wire exits the wire guide throughout Step 702 (e.g., see FIG. 6B). The protrusion may include a radius where the wire contacts the protrusion during Step 702 (e.g., see FIGS. 2A-2D, FIG. 6B). The wire guide may include a straight tube through which the wire is fed (e.g., see FIGS. 2A-2D and FIGS. 6A-6E). At optional Step 704, a wire clamp is closed on the wire during Step 702 to generate tension in the wire such that the wire is forced against the protrusion to form a stress concentration in the wire (e.g., see FIG. 6C). The stress concentration may be formed at a point between 30%-70% of a length of the wire loop (e.g., see FIG. 6E). At optional Step 706, the wire is bonded to a second bonding location after Step 702 (e.g., see FIG. 6E).

Although the invention has been described in connection with the formation of a wire loop, it is understood that the teachings may be applied to the formation of any wire structure on a wire bonding system. Thus, the term "wire loop" is intended to be broadly construed to include any such wire structure.

As described herein, the "protrusion" defined may be curved or have a radius of curvature. However, the invention is not limited to curved protrusions, circular protrusions, and/or protrusions having a radius of curvature. For example, a protrusion may have a variety of shapes or configurations to enhance the stress concentration at the tip of the wire guide such as pyramidal, triangular, trapezoidal, rectangular, among others.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A wire guide configured for use with a wire bonding system, the wire guide comprising:

a body portion configured to receive a wire, the body portion including a tip portion at an end of the body portion, the tip portion defining an opening through which the wire exits the wire guide for bonding with a wedge bonding tool of the wire bonding system, the tip portion including a protrusion at the opening to localize stress on a surface of the wire as the wire is fed out from the wire guide.

2. The wire guide of claim 1 wherein the wire contacts the protrusion as the wire exits the wire guide.

3. The wire guide of claim 1 wherein the protrusion has a radius.

4. The wire guide of claim 3 wherein the radius of the protrusion has a value of 125-1000 microns.

5. The wire guide of claim 3 wherein the radius of the protrusion has a value of 25%-200% of a diameter of the wire.

6. The wire guide of claim 1 wherein the wire guide is formed of a polymer material including a reinforcement filler.

7. The wire guide of claim 1 further comprising a holder for holding the body portion, the wire passing through the holder prior to receipt by the body portion.

8. The wire guide of claim 7 wherein the protrusion is configured to form a stress concentration in the wire when the wire is forced against the protrusion.

9. A wire bonding system for forming wire bonds on a workpiece, the wire bonding system comprising:

a support structure for supporting the workpiece during formation of a wire loop;

a wire guide including a body portion configured to receive a wire, the body portion including a tip portion at an end of the body portion, the tip portion including an opening through which the wire exits the wire guide, the tip portion including a protrusion at the opening to localize stress on a surface of the wire as the wire is fed out from the wire guide; and a wedge bonding tool configured to bond the wire to the workpiece during formation of the wire loop.

10. The wire bonding system of claim 9 wherein the wire contacts the protrusion as the wire exits the wire guide.

11. The wire bonding system of claim 9 wherein the protrusion has a radius, the radius having a value of 125-1000 microns.

12. The wire bonding system of claim 9 wherein the wire guide further includes a holder for holding the body portion, the wire passing through the holder prior to receipt by the body portion.

13. The wire bonding system of claim 9 further comprising a wire clamp configured to hold the wire in a position with respect to the wire guide.

14. The wire bonding system of claim 13 wherein the protrusion is configured to form a stress concentration in the wire when the wire is forced against the protrusion by closing the wire clamp while moving the wire guide.

15. A method of forming a wire loop using a wire bonding system, the method including the steps of:

(a) forming a wire bond at a bonding location of a workpiece using a wedge bonding tool; and (b) feeding a wire, continuous with the wire bond, through a wire guide while moving the wedge bonding tool and the wire guide away from the bonding location after step (a), the wire contacting a protrusion at an opening through which the wire exits the wire guide to localize stress on a surface of the wire as the wire is fed out from the wire guide, the wire contacting the protrusion throughout step (b).

16. The method of claim 15 further comprising a step of (c) closing a wire clamp on the wire during step (b) to generate tension in the wire such that the wire is forced against the protrusion to form a stress concentration in the wire.

17. The method of claim 16 wherein step (c) includes forming the stress concentration at a point between 30% and 70% of a length of the wire loop.

18. The method of claim 15 wherein the wire guide includes a body portion including a straight tube.

19. The method of claim 15 wherein the protrusion includes a radius where the wire contacts the protrusion during step (b).

20. The method of claim 15 further comprising a step of bonding the wire to a second bonding location after step (b).

* * * * *